US006199298B1

(12) United States Patent
Bergman

(10) Patent No.: US 6,199,298 B1
(45) Date of Patent: Mar. 13, 2001

(54) VAPOR ASSISTED ROTARY DRYING METHOD AND APPARATUS

(75) Inventor: Eric J. Bergman, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 0 days.

(21) Appl. No.: 09/413,622

(22) Filed: Oct. 6, 1999

(51) Int. Cl.[7] .................................................. F26B 5/08
(52) U.S. Cl. ............................. 34/315; 34/317; 34/319; 34/58; 134/902
(58) Field of Search ............................. 34/315, 317, 318, 34/319, 321, 58; 134/902

(56) References Cited

U.S. PATENT DOCUMENTS

| 4,643,774 | 2/1987 | Kishida et al. . |
| 4,722,752 | 2/1988 | Steck . |
| 4,736,758 | 4/1988 | Kusuhara . |
| 4,778,532 | 10/1988 | McConnell et al. . |
| 4,816,081 | 3/1989 | Mehta et al. . |
| 5,271,774 | 12/1993 | Leenaars et al. . |
| 5,301,701 | 4/1994 | Nafziger . |
| 5,371,950 | 12/1994 | Schumacher . |
| 5,421,905 | 6/1995 | Ueno et al. . |
| 5,487,398 | 1/1996 | Ohmi et al. . |
| 5,556,479 | 9/1996 | Bran . |
| 5,653,045 | 8/1997 | Ferrell . |
| 5,738,128 | * 4/1998 | Thompson et al. .................. 134/95.2 |
| 5,784,797 | 7/1998 | Curtis et al. . |
| 5,945,161 | * 8/1999 | Hashimoto et al. .................. 427/240 |
| 5,954,911 | 9/1999 | Bergman ............................. 156/345 |
| 6,122,837 | * 9/2000 | Olesen et al. .......................... 34/315 |

* cited by examiner

Primary Examiner—Pamela Wilson
(74) Attorney, Agent, or Firm—Lyon & Lyon LLP

(57) ABSTRACT

A process for drying semiconductor wafers includes loading a wafer wetted with rinsing fluid into a rotor and orientating the wafer along a substantially vertical plane. A gas saturated with a solvent vapor is passed over the wafer surfaces until condensation forms on the wafer and displaces residual fluid. The rotation of the wafer by the rotor at a first rotation speed to aids the flushing and displacement of residual fluid. The passage of a dry gas over the wafer combined with the rotation of the wafer at a second rotation speed promotes drying of solvent condensed on the wafer. The first rotation speed is limited to a rate that does not cause the condensed solvent film to evaporate as quickly as it forms. The second rotation speed may exceed that of the first rotation speed to complete the drying of the wafer. The rotor and process chamber are optionally pre-saturated with condensed solvent vapor prior to the introduction of a wafer to hasten the drying process. The process is suitable for quickly and cleanly drying patterned wafers having both hydrophobic and hydrophilic surfaces.

27 Claims, 3 Drawing Sheets

VAPOR ASSISTED ROTARY DRYING METHOD AND APPARATUS

FIELD OF THE INVENTION

The present invention relates to the processing of semiconductor wafers or similar flat media.

BACKGROUND OF THE INVENTION

One of the most critical steps in the wet-processing of semiconductor wafers or similar flat media, (such as photomasks, flat panel displays, hard disk media, CD glass, etc.) is the drying. Any rinsing fluid that remains on the surface of a semiconductor wafer has potential for depositing contaminants that may cause defects in the end product electronic device. In practice, deionized ("DI") water is used most frequently used as the rinsing fluid. Like most other fluid after rinsing, DI water will cling to wafer surfaces in sheets or droplets, due to surface tension. Ideally, the drying process should operate quickly and cost effectively to remove fluid and leave absolutely no contaminants on the wafer surface, while presenting no environmental or safety risks.

Various technologies have been used in the past to dry wafers and reduce the level of contaminants left on the wafer surface after drying. Whether a particular drying technology is appropriate for drying a wafer often depends on the affinity of the wafer surface for water in other words, whether a wafer surface is hydrophilic or hydrophobic. It is especially difficult to completely dry patterned wafers which have both hydrophilic and hydrophobic regions present, due to the varying droplet characteristics—large isolated droplets in the hydrophobic regions and a water film covering the hydrophilic regions.

Some drying technologies that have been used in the past include the following:

A. Spin-Rinse Dryers. These dryers operate on two fundamental mechanisms. First, the wafer is set into spinning motion to remove bulk liquid from the wafer surface by centrifugal force. Following removal of the bulk liquid, some liquid remains on the wafer surface because surface tension between the substrate and the residual liquid is greater than the level of centrifugal force that can be reasonably applied to the wafer especially near the center of the wafer. A second mechanism, evaporation, is then used to complete the drying process. The evaporation rate is commonly increased by maintaining a relatively high rotational velocity on the wafer, thus improving convection. Heated nitrogen gas is typically injected into the process chamber to further increase evaporative drying.

This drying technology is limited, however, by the following factors: (1) With hydrophobic surfaces, water drops can tend to become isolated on the water surface and are difficult to remove, and contaminants entrained in such droplets are deposited on the wafer surface. (2) Very high spin velocities, which improve drying, must be avoided due to the mechanical stress limits of the wafer and the tendency of high rotation speeds to generate turbulence which can cause contaminants to deposit on the wafer surface. This limits manufacturing throughput rates.

B. Isopropyl Alcohol (IPA) Vapor Dryers. These dryers operate by immersing wafers wetted with DI water into a heated environment saturated with IPA vapor. Liquid IPA has a significantly lower surface tension than water. In the typical IPA vapor dryer, the vapor chamber itself is heated to maintain an interior wall temperature of around 80–120 degrees C. As IPA starts to condense on the wafer surface, water on the surface is displaced by IPA. The wafer is maintained in the vapor zone for about 5 minutes, which allows the wafer to become quite warm. When the water has been displaced by IPA, the wafer is then withdrawn through a cool zone (having a series of heat exchange coils operating at about 50 degrees C. or less) which completes the condensation of the alcohol and causes it to flow off of the wafer surface. If any water dries in place on the wafer, however, it will leave a water mark in the form of a spot or streak which is detectable by a particle counter.

This drying technology is limited by the following factors: (1) It involves the inherent hazard of causing IPA, a flammable liquid, to be boiled at a temperature well in excess of its flash point. (2) It requires the consumption of IPA at relatively high rate. (3) It creates relatively high fugitive organic vapor emissions.

C. Leenaars et al., U.S. Pat. No. 5,271,774, discloses a device for removing liquids from the surface of a wafer using rotary motion in conjunction with an unsaturated solvent vapor contacting the wafer. The vapor is delivered to the wafer in an unsaturated state to prevent condensation on the wafer surface so as to avoid an additional drying treatment. The vapor is miscible with the liquid film on the wafer, resulting in a mixed-liquid film on the wafer having a surface tension lower than the original liquid film. This mixed-liquid film is then removed from the wafer surface by centrifugal forces generated by rotation of the wafer as the vapor continues to be passed over the wafer surface.

This drying technology is limited by the following factors: (1) Mixing between the unsaturated vapor and the liquid film on the wafer surface occurs slowly. This limits the manufacturing throughput rates. (2) It is not useful for drying more than one surface of a wafer at a time.

In light of the limitations inherent to these and other drying processes, it is an object of the present invention to provide a novel process for drying semiconductor wafers or similar items quickly and safely while leaving minimal levels of particle contaminants or chemical residue.

It is a further object to provide a novel process for drying patterned semiconductor wafers or similar items having both hydrophobic and hydrophilic regions.

It is yet a further object of the invention to accomplish such drying while reducing the hazards and emissions associated with drying wafers or similar items using volatile chemicals.

SUMMARY OF THE INVENTION

To these ends, an method for drying semiconductor wafers, according to a first aspect of the invention, includes placing a wafer wetted with rinsing fluid on a rotor. The rotor is preferably oriented with the wafer in a substantially vertical plane. A gas saturated with a solvent vapor is passed over the wafer surfaces until condensation forms and displaces residual fluid. The rotation of the wafer by the rotor at a first rotation speed assists in the flushing and displacement of residual fluid. The passage of a dry gas over the wafer combined with the rotation of the wafer at a second rotation speed promotes drying of solvent condensed on the wafer.

In performing the method, it is advantageous to:

(1) Wet the wafer with condensed solvent vapor as quickly as possible. (2) Displace residual rinsing fluid with condensate as quickly and thoroughly as possible. (3) Remove the solvent condensate from the wafer surface completely.

The solvent is preferably a low vapor pressure substance, typically an organic solvent. Preferably, the rotor is contained within an enclosed process chamber for performing the method. The dry gas is heated before being passed over the wafer.

In second aspect of the invention, the process chamber is pre-heated and pre-saturated with solvent condensate by injecting saturated vapor into the process chamber before placing the wafer in or on the rotor. This pre-saturation of the chamber and rotor accelerates the subsequent condensation of solvent vapor on the wafer when it is placed into the process chamber and saturated vapor is passed over the wafer.

In a third aspect of the invention, a vapor recovery system is provided at the exhaust of the process chamber to condense solvent vapor and prevent its escape into the environment. Solvent consumption is reduced by directing recovered solvent through a condensate processing and filtration system, and then returning it to a solvent reservoir.

BRIEF DESCRIPTION OF THE DRAWINGS

Other objects and features of the present invention will become apparent from the following detailed description taken in conjunction with the accompanying drawings which disclose embodiments of the invention. It is to be understood, however, that the drawings are designed for the purpose of illustration only and are not intended as a definition of the limits of the invention.

In the drawings, where the same reference numbers denotes the same element, throughout the several views.

DETAILED DESCRIPTION OF THE PREFERRED EMBODIMENT

Figure 1:
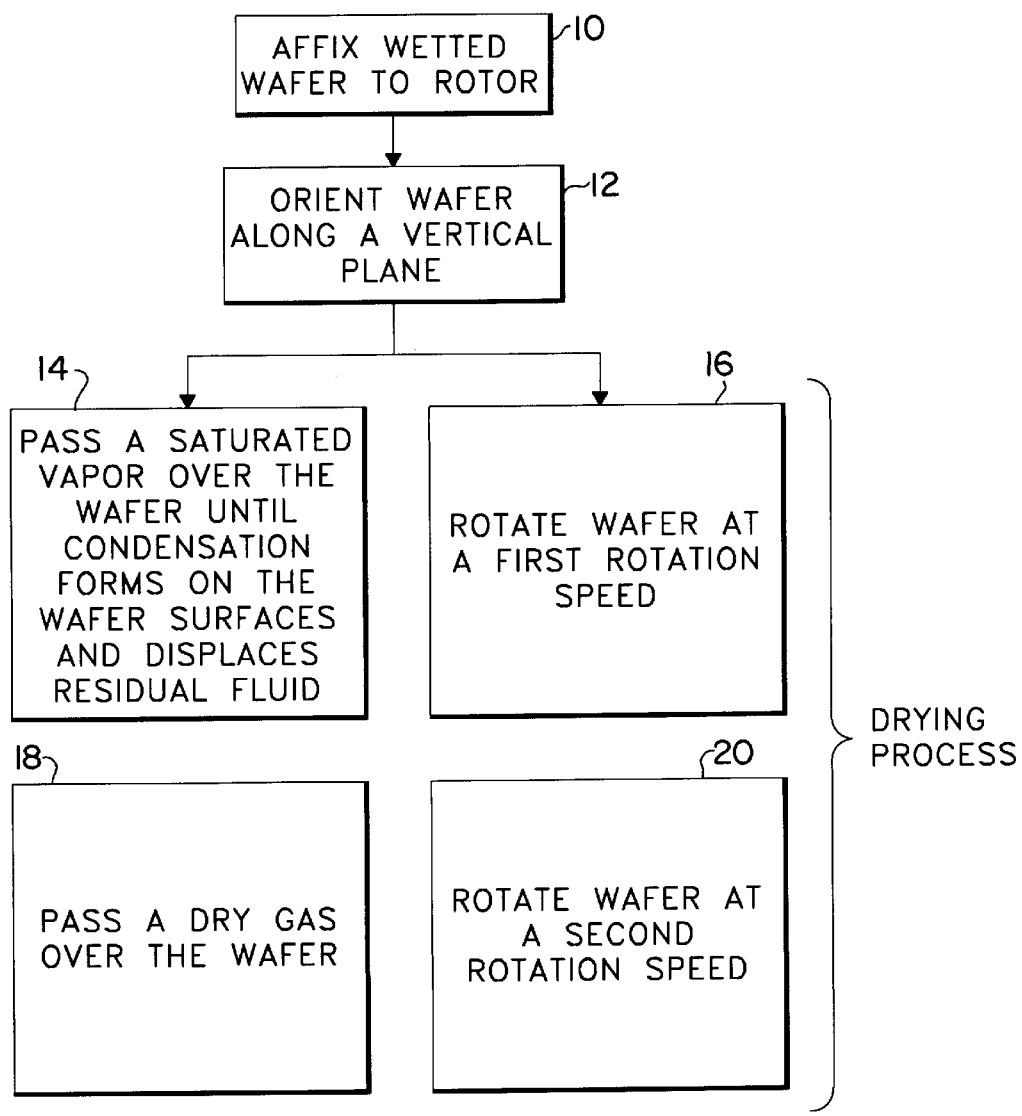
FIG. 1 is a diagram illustrating the processing steps of the vapor assisted rotary drying method of the present invention.

FIG. 1 illustrates the basic steps of a semiconductor wafer drying method in accordance with one aspect of the present invention. Although the drying process is described here in reference to the wet processing of semiconductor wafers, it applies as well to other articles such as disks, substrates, panels, etc. The term "wafers" here includes these and other similar articles.

Referring now in detail to FIG. 1, at least one wafer initially wetted with rinsing fluid is affixed to a rotor in a process chamber, as represented in step 10. Although the wafer may undergo several wet processing steps in this chamber or others, the final wet processing step usually includes immersing the wafer in a rinsing liquid or spraying rinsing liquid onto the wafer. At the conclusion of what may be several rinsing cycles, the last rinsing cycle typically uses deionized water. If not already oriented vertically, the wafer is oriented along a substantially vertical plane to prepare it for drying, as shown in step 12. This orientation allows gravity to assist the drying process along both faces of the wafer. Substantially vertical means in a position such that the effect of gravity contributes to the drying process, preferably within 30° of vertical, and most preferably within 15° of vertical. The orientation of the wafer along a substantially vertical plane allows gravity to aid the displacement and flushing of the residual fluid away from the wafer surface by the solvent condensate.

The next step in the drying process includes two procedures that preferably partially overlap in time. The first procedure is passing a gas stream saturated with solvent vapor over the wafer to form a condensate film on the wafer surfaces. The solvent is a low vapor pressure substance, typically an organic solvent, especially an aliphatic alcohol such as isopropyl alcohol (IPA). As shown in step 14, this vapor stream is supplied to the wafer and condenses on the wafer. The condensate displaces residual fluid on the wafer surfaces. The intent is to flood the wafer surface, thereby displacing the residual fluid as quickly as possible. Supply of vapor to the wafer and rotation of the wafer at the first rotation speed proceeds until solvent condensed on the wafer completely displaces and flushes away the residual rinsing fluid The second procedure, as shown in step 16, is rotating the wafer by the rotor at a first rotation speed. Preferably, the wafer is not moving when the vapor stream is first supplied to the wafer. Rotational acceleration of the wafer now wetted by the condensed solvent proceeds up to a first rotation speed, to thin the boundary layer at the wafer surface and increase the rate of exchange at the surface. This helps to remove all residual fluid so that only condensate remains on the wafer surface. Rotating the wafer during this step provides the further benefit of reducing the amount of solvent required to displace residual fluid from the wafer surface, to ensure a clean drying process. This first rotation speed is from about 300–700 rpm, preferably 500 or 550–650 rpm (when processing 200 mm diameter wafers). High rotational speeds should be avoided since the wafer condensate film forms most quickly at low rotational speeds. High rotation speeds are less effective as they tend to evaporate the condensate as quickly as it forms. This first rotation speed should be low enough to allow condensate to form and displace the rinsing fluid.

The remaining step in the drying process advantageously includes two procedures that also overlap in time. The first procedure is passing a dry gas over the wafer, as shown in step 18. This dry gas evaporates the solvent remaining on the wafer surface. Convective drying via the dry gas may be further aided by optionally heating the dry gas before supplying it to the wafer surface. The second procedure, which advantageously occurs simultaneously with the passing of the dry gas over the wafer, is the rotation of the wafer at a second rotation speed, as shown in step 20. This second rotation speed can be higher than the rotation speed of the previous step, because the objective is to complete the drying of the wafer surface. Rotation of the wafer at the second rotation speed promotes removal of residual solvent by both centrifugal force and evaporation. Preferably, the dry gas is supplied to the wafer and the wafer is rotated at the second rotation speed until the wafer is dry. The second rotation speed is about 800–1800 rpm, preferably 800–1400 rpm.

Experimental results confirm the efficacy of a method according to the present invention in speeding up the drying process compared to prior art methods. A wafer rinsed with DI water requires in excess of 6–10 minutes to dry with nitrogen delivery to the wafer while the wafer spins at 600 RPM. With isopropyl alcohol vapor delivered to the process chamber for 2 minutes and fully displacing the residual water with the rotor spinning at 600 RPM, the wafer is dried in less than 5 minutes with nitrogen delivery to the wafer and continued rotation at 600 RPM.

The wafers should be wetted with the alcohol vapor condensate as quickly as possible. In performing the method, a liquid condensate film should form (visibly) on the wafers in less than 30 seconds, and preferably in less than 15 seconds. The residual water should be displaced by the alcohol as quickly and as thoroughly as possible, with displacement completed in less than 90 seconds, and preferably less than 60 seconds, more preferably in less than 45 seconds, with less than 30 or 30–40 seconds even more preferred. The alcohol should be removed (visibly indicated by the end of color change) in less than 60 seconds, preferably in less than 45 or 30 seconds.

Figure 2:
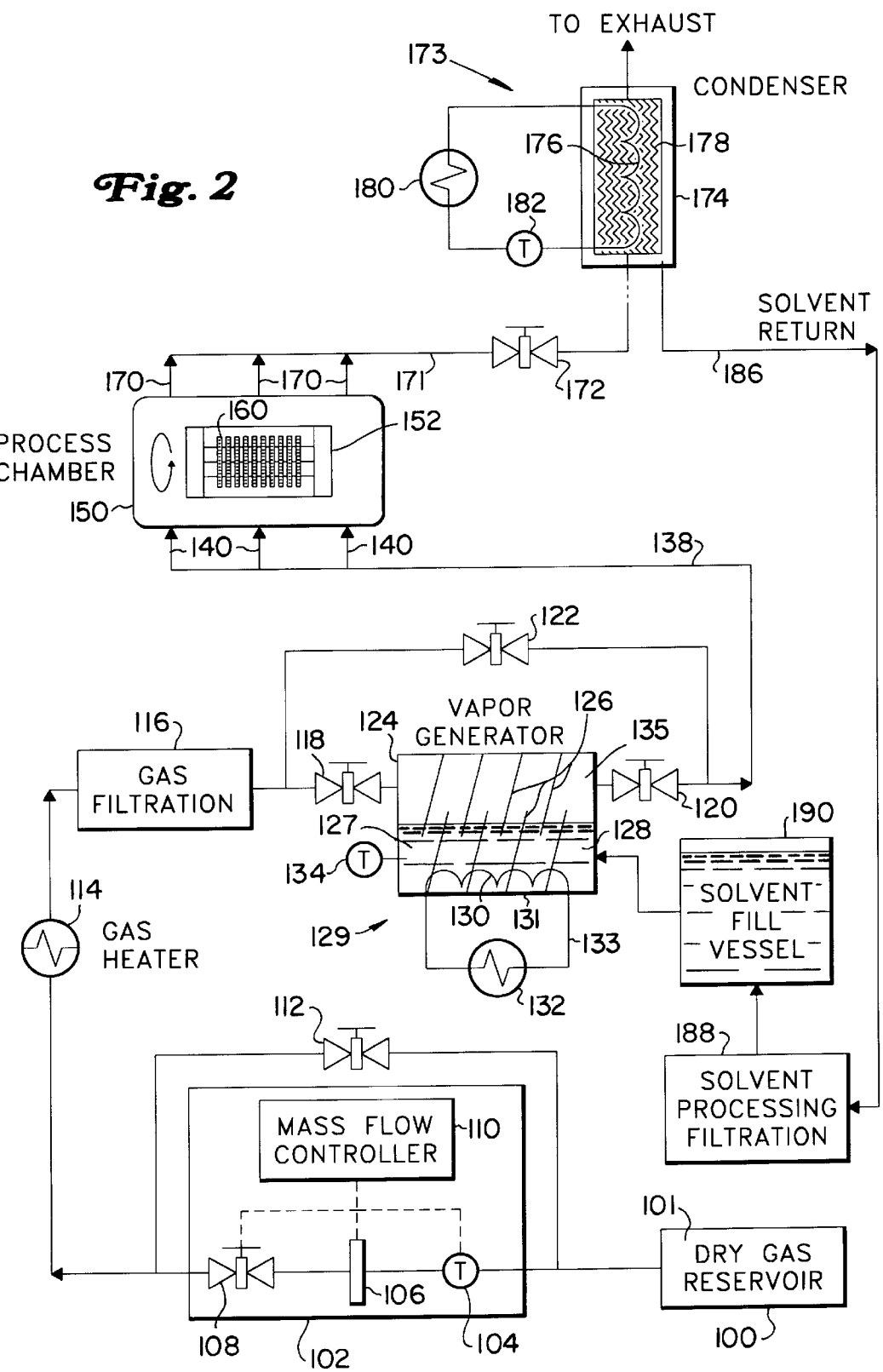
FIG. 2 is a process flow diagram of the vapor assisted rotary drying method of the present invention.

FIG. 2 illustrates a process flow diagram for a wafer drying method according to one embodiment of the present invention. Upon placement of a wetted wafer 160 in the process chamber 150, the drying process is initiated by releasing dry gas 101 from a pressurized dry gas reservoir 100 by opening a regulating valve 104. Various gases can be used as the dry gas so long as the gas used is inert, to minimize the potential for reaction with the solvent, wafer, rinsing fluid, or any contaminants present. Suitable gases include nitrogen, carbon dioxide, and argon. However, nitrogen is advantageous due to its low cost. Flow of dry gas is controlled by a flow regulating system 102 that includes a temperature sensor 104, flow element 106, and regulating valve 108 connected to a mass flow controller 110.

The dry gas 101 preferably flows from the flow regulating system 102 to a gas heater 114 that heats the gas 101 to a temperature of approximately 50 degrees C. or greater. While this heating step is optional, it helps maintain saturation of the gas-vapor mixture upon mixing with solvent vapor produced by the vapor generator. The piping and components downstream of the gas heater are preferably heated or insulated. Downstream of the gas heater 114, the gas is then filtered through a gas filter 116 to remove any potential contaminants entrained in the gas.

The vapor generator 124 comprises a solvent reservoir 127 and solvent heater 129 that heats the solvent to a temperature of approximately 50 degrees C. via heat exchange coils that exchange heat provided from an external heater 132 via circulating water 133. Alternatively, an interposing medium such as the bottom wall of the solvent reservoir 127 may be heated instead of the heat exchange coils 130. A temperature sensor 134 provides feedback temperature control of the liquid solvent 128. To maximize the contact between the gas 101 and the solvent 128, and therefore promote saturation, a spiral baffle 126 is positioned inside the vapor generator 124. The gas 135 supplied to the vapor generator 124 may be maintained in a saturated or nearly-saturated state with entrained solvent vapor by regulating the mass flow of the dry gas 101 relative to the vapor production rate by the vapor generator 124. The vapor production rate may be measured by monitoring the rates of heating and liquid solvent 128 consumption by the vapor generator 124. Because of the difficulty of maintaining vapor in a truly saturated state, the term "saturated" here means saturated or nearly saturated, within the limits of the vapor generator and system.

From the vapor generator 124, the saturated gas-vapor mixture 135 flows to the process chamber 150 via delivery lines 138 and a vapor delivery manifold 140. These lines 138 and manifold 140 should be as short and direct as possible to prevent the saturated gas-vapor mixture 135 from cooling before flowing into the process chamber 150. Accordingly, the vapor generator 124 is preferably located immediately adjacent to the process chamber 150. The lines 138 and manifold 140 should also be heated and insulated to prevent vapor from condensing in the lines 138 and manifold 140, which would result in liquid spitting and unstable delivery of the gas-vapor mixture to the process chamber 150.

The process chamber 150 is preferably constructed from stainless steel for its thermal conductivity and resistance to attack from organic solvents. The chamber 150 may be optionally heated by electric or other means and blanketed with insulation to maintain the chamber at a temperature of approximately 40 to 60 degrees C. Radiant heating of the wafer 160 by the stainless chamber 150 helps maintain the rotor 152 at an elevated temperature so as to minimize vapor formation on surfaces other than that of the wafers 160 in the rotor and allow rapid evaporative drying at the end of the process. The process chamber 150 is preferably completely enclosed except for the inlet piping 140 and exhaust piping 170. Its surface area is preferably minimized to promote more rapid condensation on wafer surfaces when introduced to the chamber 150. To further promote rapid solvent condensation on the wafer 160, the process chamber 150, along with the rotor 152, may optionally be pre-saturated with condensed solvent by operating the vapor generator 124 and delivering a gas-vapor mixture to the chamber 150 before the wafer 160 is placed in the rotor. This pre-saturation may be aided by closing a gas exhaust valve 172 during the pre-saturation step to prevent vapor escape.

The process chamber 150 may be alternatively constructed from a polymer material, such as HDPE, so as to provide the capability to perform chemical processing, rinsing, and drying all in a single vessel. Due to its lower thermal conductivity, however, a polymer chamber is likely to be less efficient at drying wafers than a steel chamber using a wafer drying method according to the present invention. A finishing rinse, using hot water, may be used, to heat the rotor and chamber.

Like the process chamber 150, the rotor 152 preferably has minimal surface area minimize condensation on the chamber and rotor, and to maximize condensation on the wafer 160. The rotor 152 is preferably fabricated from a material such as stainless steel to permit high rotor speeds of up to 1800 RPM, and to ensure compatibility with all the chemistries to be run in the process chamber 150. The rotor holds one or more wafers. See U.S. Pat. No. 5,784,797, incorporated herein by reference.

With the system of FIG. 2 in use, upon introduction of the saturated vapor mixture into the chamber, the vapor starts condensing on the surfaces of the wafer 160. The wafer 160 is then rotated by the rotor 150 and accelerated up to the first rotation speed, to thin the boundary layer at the surface of the wafer 160.

Once all residual fluid has been displaced from the wafer 160 by condensed solvent, the wafer 160 is dried as completely as possible by rotating the wafer up to the second rotation speed and passing dry gas 101—without vapor—over the surfaces of the wafer 160 in the process chamber 150. Dry gas 101 may be supplied to the wafer 160 by closing isolation valves 118, 120 adjacent to the vapor generator 124 and opening a vapor generator bypass valve 122. Since measuring the flow of the dry gas 101 is unimportant when it bypassed the wafer generator 124 and is supplied to the process chamber 150, the flow regulating system 102 may also be bypassed by opening a dry gas bypass valve 112.

From the dry gas reservoir 100, the gas 101 preferably is routed through the dry gas bypass valve 112 to the gas heater 114 where it is heated up to approximately 50 degrees C. or more, then filtered through a gas filter 116 to remove any potential contaminants, and then through the vapor generator bypass valve 122 to the process chamber 150. The heated dry gas evaporates the solvent remaining on the surfaces of the wafer 160 by convection. Rotation of the wafer 160 at the second rotation speed promotes removal of residual solvent by both centrifugal force and evaporation. Rotation of the wafer 160 and delivery of dry gas 101 to the wafer proceeds until the wafer 160 is dry.

The gas or unsaturated gas-vapor mixture exits the process chamber 150 by an exhaust manifold 170 that collects the mixture into exhaust piping 171. The mixture is ducted to a solvent recovery system 173 having a condensation chamber 174, a condenser coil 176, an external chiller/heat exchanger 180, and a condensate recovery trap 178. The gas-vapor mixture enters the condensation chamber 174, where the vapor condenses upon contacting the cool condenser coil 176. The carrier gas may be exhausted outside the drying apparatus. The solvent recovery system 173 reduces both solvent emissions and solvent consumption. The condensate recovery trap 178 collects the liquid condensate and directs it to the bottom of the condensation chamber, where solvent return piping 186 routes the condensed solvent to a processing and filtration system 188 to remove contaminants before returning the solvent to the solvent fill vessel 190. Solvent level is maintained in the reservoir 127 of the vapor generator 124 by regulation from the solvent fill vessel 190.

Figure 3:
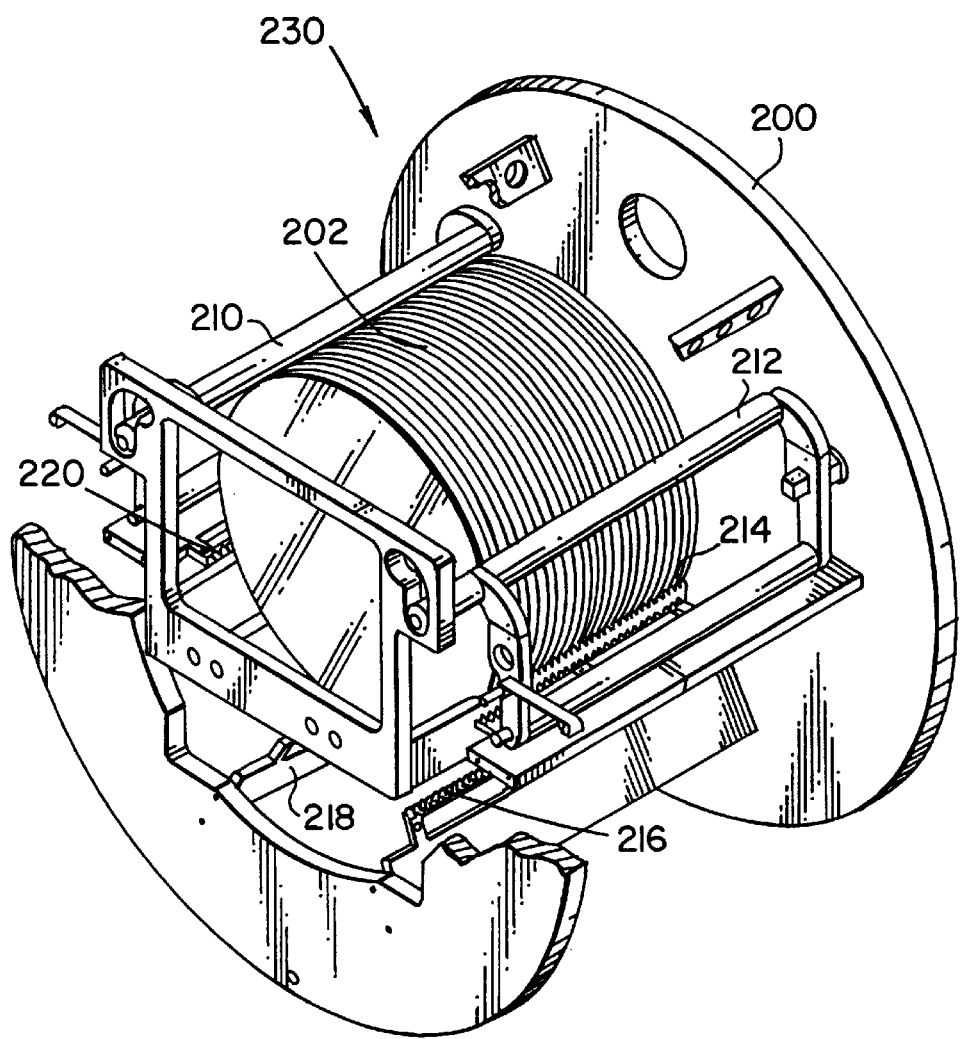
FIG. 3 is a partial cut-away perspective view of a rotor that may be used to dry a plurality of wafers using the vapor assisted rotary drying method of the present invention.

FIG. 3 illustrates a rotor 200 which may be used to dry wafers or other similar flat media using a method according to the present invention. A plurality of wafers 202, each oriented along vertical planes, are placed in the rotor 200 via retaining elements 210, 212, 214, 216, 218, and 220. The rotor 200 holds the wafers 202 or other articles in a spaced array without a wafer carrier to improve fluid access to the wafers 202. One or more wafers 202 are preferably loaded onto the rotor 200 within a process chamber via a robotic arm, as shown in U.S. Pat. Nos. 5,664,337; 5,660,517; or 5,678,320, incorporated herein by reference.

The methods described above have several advantages over prior known drying methods. There is no boiling alcohol or solvents used. The vapor generator operates at 30–80 degrees C., preferably at 40–70 degrees C., and with an ideal target temperature of 50 degrees C. This is much lower than the usual 100–180 C. range maintained in most IPA vapor dryers. The hazards of very hot alcohol are avoided. Spinning the wafers during drying minimizes both the time and amount of alcohol required to displace water from the wafer surface. Using centrifugal force, via spinning the wafers, rather than gravitational force, displacement of fluid is achieved in less time and with a lower concentration of IPA forming a film on the wafer surface. The enclosed process chamber minimizes vapor emissions during processing.

Though the present invention has been described in terms of certain preferred embodiments, other embodiments apparent to those skilled in the art should also be considered as within the scope of the present invention. Elements and steps of one embodiment may also readily be used in other embodiments. Substitutions of steps, devices, and materials, will be apparent to those skilled in the art, and should be considered still to be within the spirit of the invention. Accordingly, the invention should not be limited, except by the following claims, and their equivalents. The term "wafer" as used above and in the following claims is defined to include all of the other types of flat media, single or plural.

What is claimed is:

1. A method for drying a semiconductor wafer initially having at least one surface wetted with rinsing fluid, comprising the steps of:

placing the wafer in a rotor and orienting the at least one surface in a substantially vertical plane;

rotating the wafer with the rotor at a first rotation speed;

passing a saturated vapor over the wafer to condense the vapor into condensate on the surfaces of the wafer;

rotating the wafer affixed to the rotor at a second rotation speed to remove the bulk of the condensate from the surfaces of the wafer; and passing a dry gas over the wafer.

2. The method of claim 1 wherein the saturated vapor is passed over the wafer before the wafer is accelerated up to the first rotation speed, the saturated vapor is passed over the wafer while the wafer is rotating at the first rotation speed, and the dry gas is passed over the wafer while the wafer rotates at the second rotation speed.

3. The method of claim 1 wherein the saturated vapor is passed over the wafer simultaneously with the rotation of the wafer at a first rotation speed, and the dry gas is passed over the wafer simultaneously with the rotation of the wafer at the second rotation speed.

4. The method of claim 1 wherein the saturated vapor is passed over the wafer until condensate formed thereby completely displaces the rinsing fluid along the at least one surface of the wafer.

5. The method of claim 1 wherein the second rotation speed is greater than the first rotation speed.

6. The method of claim 1 wherein the second rotation speed is approximately equal to the first rotation speed.

7. The method of claim 1, wherein the first rotation speed is approximately 600 revolutions per minute.

8. The method of claim 1 wherein the vapor is an organic solvent.

9. The method of claim 8 wherein the organic solvent is an aliphatic alcohol.

10. The method of claim 9 wherein the aliphatic alcohol is an isopropyl alcohol.

11. The method of claim 1 wherein the rinsing fluid is deionized water.

12. The method of claim 1 wherein the dry gas is selected from the group consisting of nitrogen, carbon dioxide, and argon.

13. The method of claim 1 wherein the dry gas is heated before being passed over the wafer.

14. The method of claim 1 wherein the saturated vapor is a saturated vapor mixture of solvent vapor entrained in a carrier gas.

15. The method of claim 1 wherein the saturated vapor is supplied to the wafer at a temperature between approximately 40 degrees C. and approximately 70 degrees C.

16. The method of claim 1 wherein the saturated vapor is supplied to the wafer at a temperature of approximately 50 degrees C.

17. The method of claim 1 wherein the following steps are executed within a totally enclosed process chamber: rotating the wafer at a first rotation speed, passing the saturated vapor over the wafer, rotating the wafer at a second rotation speed, and passing the dry gas over the wafer.

18. The method of claim 17, further comprising the step of heating the rotor and process chamber before affixing the wafer to the rotor.

19. The method of claim 18, wherein the rotor and process chamber are heated to a temperature greater than the temperature of the wafer.

20. The method of claim 19, wherein the process chamber is heated externally.

21. The method of claim 18 wherein the heating of the rotor and process chamber is accomplished by passing heated dry gas into the process chamber and over the rotor.

22. The method of claim 17 wherein saturated vapor is injected into the process chamber containing the rotor until condensate forms on the surfaces of the rotor and the interior surfaces of the chamber before affixing the wafer to the rotor.

23. The method of claim 17, wherein the process chamber is insulated.

24. The method of claim 1, wherein the wafer has both hydrophilic and hydrophobic regions comprising the at least one surface initially wetted with rinsing fluid.

25. The method of claim 1, wherein the wafer has two surfaces initially wetted with rinsing fluid.

26. The method of claim 1, wherein the dry gas passing over the wafer evaporates and mixes with the condensate to form a vapor, the method further comprising the step of exhausting the vapor in an exhaust stream from the process chamber and through a condenser by which the vapor is condensed and removed from the exhaust stream.

27. A method for drying at least one semiconductor wafer initially having two surfaces wetted with rinsing fluid, the method comprising the steps of:
  affixing the at least one wafer to a rotor and orienting the surfaces in a substantially vertical plane;
  mixing a stream of heated nitrogen gas with isopropyl alcohol vapor to form a saturated vapor mixture;
  passing the saturated vapor mixture over the at least one wafer to condense the vapor into condensate on the surfaces of the at least one wafer;
  rotating the at least one wafer at a first rotation speed;
  passing a dry gas over the wafer; and
  rotating the at least one wafer affixed to the rotor at a second rotation speed.

* * * * *